United States Patent
Zhang

(10) Patent No.: US 11,350,498 B2
(45) Date of Patent: May 31, 2022

(54) CONTROL CIRCUIT, LED DRIVING SYSTEM AND CONTROL METHOD THEREOF

(71) Applicant: Xiamen Kiwi Instruments Corporation, Xiamen (CN)

(72) Inventor: Bo Zhang, Hangzhou (CN)

(73) Assignee: XIAMEN KIWI INSTRUMENTS CORPORATION, Xiamen (CN)

( * ) Notice: Subject to any disclaimer, the term of this patent is extended or adjusted under 35 U.S.C. 154(b) by 1 day.

(21) Appl. No.: 17/010,348

(22) Filed: Sep. 2, 2020

(65) Prior Publication Data

US 2020/0404759 A1 Dec. 24, 2020

(30) Foreign Application Priority Data

Sep. 4, 2019 (CN) .......................... 201910830592.2

(51) Int. Cl.
*H05B 45/325* (2020.01)
*H05B 45/20* (2020.01)
*H03K 17/687* (2006.01)

(52) U.S. Cl.
CPC ......... *H05B 45/325* (2020.01); *H03K 17/687* (2013.01); *H05B 45/20* (2020.01)

(58) Field of Classification Search
CPC ........ H05B 45/10; H05B 45/14; H05B 45/20; H05B 45/24; H05B 45/30; H05B 45/32; H05B 45/325; H05B 47/10; H05B 47/105; H05B 47/14; H05B 47/23

See application file for complete search history.

(56) References Cited

U.S. PATENT DOCUMENTS

| | | | |
|---|---|---|---|
| 8,044,609 B2* | 10/2011 | Liu | H05B 45/347 315/312 |
| 8,129,916 B2* | 3/2012 | Godbole | H05B 45/10 315/225 |
| 8,860,325 B2 | 10/2014 | Chen | |
| 9,769,888 B2* | 9/2017 | Wang | H05B 45/3725 |
| 2009/0134817 A1* | 5/2009 | Jurngwirth | H05B 45/10 315/307 |
| 2011/0140621 A1* | 6/2011 | Yi | H05B 45/10 315/307 |
| 2011/0227493 A1* | 9/2011 | Du | H05B 45/385 315/192 |

(Continued)

FOREIGN PATENT DOCUMENTS

| CN | 109526106 A | 3/2019 |
|---|---|---|
| CN | 110461066 A | 11/2019 |

*Primary Examiner* — Jason Crawford
(74) *Attorney, Agent, or Firm* — Nz Carr Law Office PLLC

(57) ABSTRACT

A control circuit for controlling a power transistor is provided. The power transistor is coupled in series with a load, both coupled between an input power terminal and a reference ground. The control circuit controls the conduction state of the power transistor based on a dimming signal, and when a representative value of the dimming signal is higher than a first threshold, the control circuit regulates the amplitude of the current flowing through the power transistor, and when the representative value of the dimming signal is lower than a second threshold, the control circuit regulates the time of the current flowing through the power transistor, and wherein the second threshold is not higher than the first threshold.

16 Claims, 6 Drawing Sheets

(56) References Cited

U.S. PATENT DOCUMENTS

| | | | | |
|---|---|---|---|---|
| 2011/0227496 A1* | 9/2011 | Lin | .................... | H05B 45/3725 |
| | | | | 315/209 R |
| 2011/0248648 A1* | 10/2011 | Liu | ........................ | H05B 45/14 |
| | | | | 315/246 |
| 2013/0278145 A1* | 10/2013 | Lin | ........................ | H05B 45/10 |
| | | | | 315/122 |
| 2014/0070727 A1* | 3/2014 | Pflaum | ................. | H05B 45/375 |
| | | | | 315/307 |
| 2014/0070728 A1* | 3/2014 | Pflaum | ................. | H02M 3/156 |
| | | | | 315/307 |
| 2014/0091723 A1* | 4/2014 | Kuo | ................... | H05B 45/3725 |
| | | | | 315/200 R |
| 2014/0340000 A1* | 11/2014 | Zhang | .................... | H05B 45/38 |
| | | | | 315/307 |
| 2014/0354180 A1* | 12/2014 | Zhang | ................. | G09G 3/3426 |
| | | | | 315/307 |
| 2015/0076999 A1* | 3/2015 | Malinin | ................. | H05B 45/46 |
| | | | | 315/186 |
| 2016/0044759 A1* | 2/2016 | Lai | ........................ | H05B 45/48 |
| | | | | 315/186 |
| 2016/0119988 A1* | 4/2016 | Ruan | ...................... | H05B 45/10 |
| | | | | 315/186 |
| 2016/0219663 A1* | 7/2016 | Chen | ...................... | H05B 45/10 |
| 2019/0004370 A1* | 1/2019 | Gamperl | .............. | G09G 3/3426 |
| 2019/0182921 A1* | 6/2019 | Li | ........................ | H05B 45/10 |
| 2019/0394845 A1* | 12/2019 | Chen | .................... | H05B 45/00 |
| 2020/0344857 A1* | 10/2020 | Chen | .................... | H05B 45/395 |
| 2020/0404759 A1* | 12/2020 | Zhang | .................... | H05B 45/10 |

\* cited by examiner

CONTROL CIRCUIT, LED DRIVING SYSTEM AND CONTROL METHOD THEREOF

CROSS-REFERENCE TO RELATED APPLICATIONS

This application claims priority to and the benefit of Chinese Patent Applications No. 201910830592.2, filed on Sep. 4, 2019, which are incorporated herein by reference in its entirety.

TECHNICAL FIELD

The present invention relates generally to electronic circuit, and more particularly but not exclusively relates to control circuit for power transistors and associated driving circuit, LED driving system and control method.

BACKGROUND

Linear LED driving circuits are accepted by the market for simple structures where the power transistor of the linear driving circuit works at linear mode. FIG. 1 illustrates a linear LED driving circuit as an example. A reference signal generator generates a signal Vref according to an external PWM light dimming signal. An operational amplifier receives a current sampling signal and the signal Vref, and provides a control signal for controlling the current flowing through the power transistor of the linear driving circuit, and accordingly the light of the LED system is regulated. However, the LED dimming control at low illumination is difficult.

On the other hand, power loss of a conventional linear driving circuit is high at high input voltage Vin, because the power consumption of the power transistor is (Vin−VF)*Io, in view of the signal waveform as illustrated in FIG. 3, and power efficiency is low accordingly.

In view of at least one of the above deficiencies, an improved circuit is required.

SUMMARY

In one embodiment, a control circuit for controlling a power transistor is provided. The power transistor coupled in series with a load, wherein a first terminal of the serially coupled power transistor and load is coupled to an input power terminal having an input voltage, and a second terminal of the serially coupled power transistor and load is coupled to a reference ground. The control circuit is configured to control the conduction state of the power transistor for controlling the current flowing through the power transistor, wherein the control circuit has an input coupled to a dimming signal, and when a representative value of the dimming signal is higher than a first threshold, the control circuit regulates the amplitude of the current flowing through the power transistor, and when the representative value of the dimming signal is lower than a second threshold, the control circuit regulates the time of the current flowing through the power transistor, and wherein the second threshold is not higher than the first threshold.

In one embodiment, an LED driving system comprises: an LED; a power transistor coupled in series with the LED, wherein a first terminal of the serially coupled power transistor and LED is coupled to an input power terminal having an input voltage, and a second terminal of the serially coupled power transistor and LED is coupled to a reference ground; and a control circuit coupled to a control end of the power transistor for regulating current flowing through the LED, wherein the control circuit has an input coupled to a dimming signal, and when a representative value of the dimming signal is higher than a first threshold, the control circuit regulates the amplitude of the current flowing through the power transistor based on the dimming signal, and when the representative value of the dimming signal is lower than a second threshold, the control circuit regulates the time of the current flowing through the power transistor based on the dimming signal, and wherein the second threshold is not higher than the first threshold.

In another embodiment, a control method for controlling current flowing through a load, the load coupled in series with a power transistor, the method comprises: receiving a dimming signal; regulating the amplitude of the current flowing through the power transistor when the representative value of the dimming signal is higher than a first threshold; and regulating the time duration of the current flowing through the power transistor when the representative value of the dimming signal is lower than a second threshold, wherein the first threshold is equal to or higher than the second threshold.

BRIEF DESCRIPTION OF THE DRAWINGS

Non-limiting and non-exhaustive embodiments are described with reference to the following drawings. The drawings are only for illustration purpose. Usually, the drawings only show part of the devices of the embodiments.

DETAILED DESCRIPTION

Reference will now be made in detail to the preferred embodiments of the application, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Throughout the specification and claims, the term "couple" as used herein, is defined as either directly, or indirectly connecting one to another via intermediary such as via electrical conducting materials which may have resistance, parasitic inductance or capacitance, or via other material(s) or component(s) as would be known to person skilled in the art without departure from the spirit and scope of the invention as defined by the appended claims.

Figure 1:
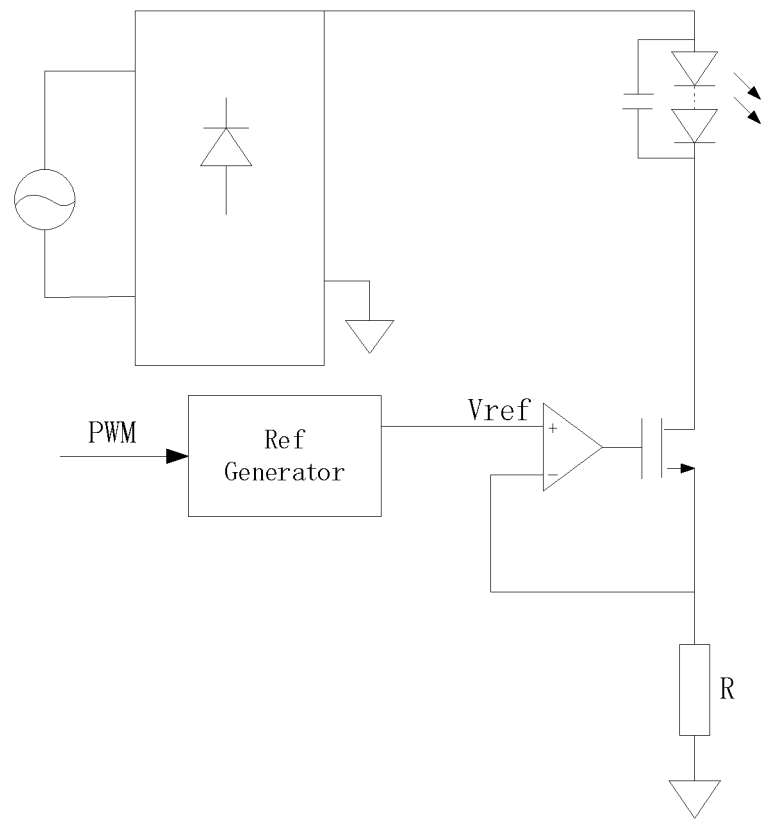
FIG. 1 illustrates a linear LED driving circuit according to a prior art example.
Figure 2:
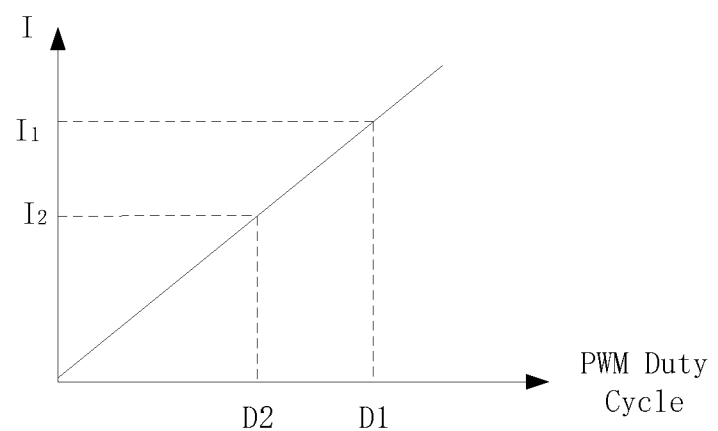
FIG. 2 illustrates a desired relationship between the duty cycle of a pulse width modulation (PWM) dimming signal and the output current Io.
Figure 3:
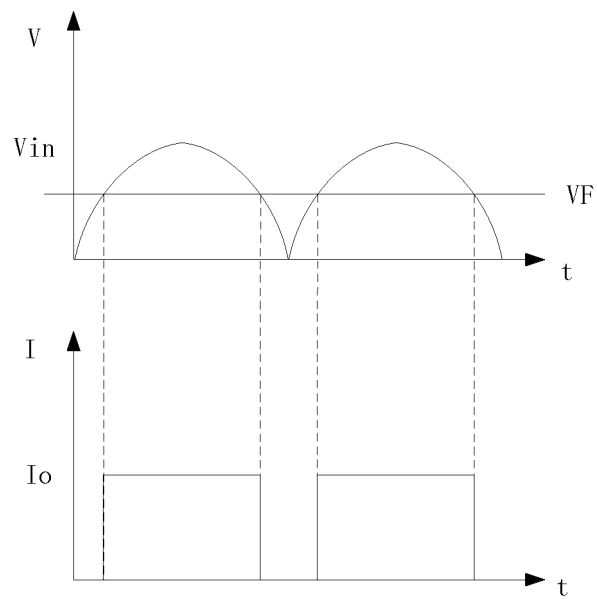
FIG. 3 illustrates a prior art waveform of current flowing through the power transistor.

FIG. 2 illustrates a desired relationship between the duty cycle of an externally introduced pulse width modulation (PWM) dimming signal and the output current Io. Referring to FIG. 1 and FIG. 2, when the duty cycle of PWM dimming signal is between D2 and zero, the reference signal Vref is required also to be small which is proportional to the duty cycle of the PWM dimming signal. However, because an operational amplifier exists bias at its input, the control accuracy is limited. For example, when the duty cycle is between D1 and D2, the reference signal Vref is proportional to the duty cycle, and accordingly the output current flowing through LED is in linear relationship with the duty cycle. When the duty cycle is lower than D2, because of the bias existing at the input of the operational amplifier, the linear relationship between the output current Io and the duty cycle can not remain, and dimming accuracy can not be guaranteed. Accordingly, improved control method or control circuit is desired.

Figure 4:
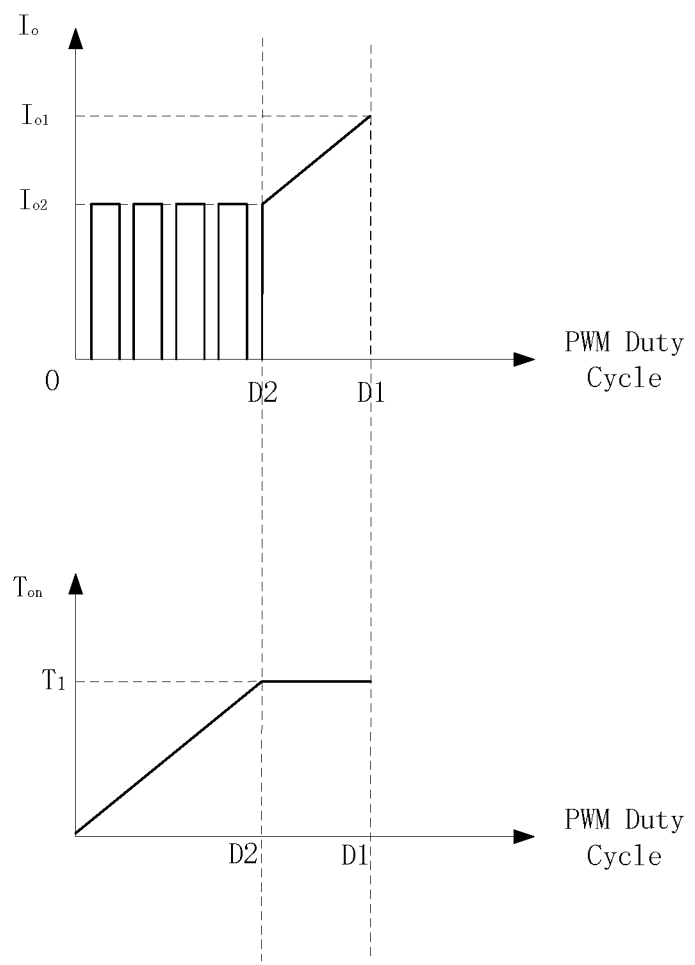
FIG. 4 illustrates two signal waveform diagrams showing the current amplitude and current flowing time respectively according to an embodiment of the present application.

FIG. 4 illustrates a signal waveform diagram showing the current amplitude and current flowing time according to an embodiment of the present application. When the duty cycle of the PWM dimming signal is higher than a first threshold D2, as shown between D1 and D2 with reference to FIG. 4, a control circuit controls the amplitude Io of the current flowing through the power transistor of a linear driving circuit, where the amplitude Io of the current flowing through the power transistor increases when the duty cycle increases. When the duty cycle of the PWM dimming signal increases from D2 to D1, the current amplitude Io increases from Io2 to Io1. And the on time Ton remains at level T1 which is the time when the input voltage Vin is higher than the load driving voltage in one cycle period of Vin. And when the duty cycle is lower than a second threshold (0-D2 zone), the control circuit control the time Ton of the current flowing through the power transistor, and the time Ton of current flowing through the power transistor increases when the duty cycle increases, where the second threshold is not higher than the first threshold. In the shown embodiment, the first threshold D2 equals to the second threshold. The illustrated current pulse between the region of 0 to D2 of the PWM duty cycle does not mean that the current at certain duty cycle is at zero value, but rather means that in this region, when the input voltage is higher than the load driving voltage which is an intrinsic forward voltage of the LED load, the output current can be controlled at zero for part of the time, in order to decrease the average current while the current amplitude is kept above a threshold to eliminate the bias effect at the input of the amplifier. When the duty cycle of the PWM dimming signal decreases from D2 to 0, the on time Ton in one cycle period of Vin decreases from T1 to 0. The threshold/thresholds may be variable or may be selected from a range according to the control mechanism of the control circuit.

In one embodiment, the control circuit is used for LED driving circuit, for LED light dimming control. The control circuit can also be used in other types of driving circuits. As shown in FIG. 4, when the duty cycle of the light dimming signal changes between D2 to D1, the amplitude of the current flowing through the LED changes while the time of the current flowing through the LED kept constant, for example, the LED is controlled at ON state or is turn ON at a predetermined fixed duty cycle or with a change below a small threshold. And when the duty cycle of the PWM dimming signal changes between 0 and D2, or lower than D2, the time of the current flowing through LED changes, while the current amplitude kept constant or with a change below a threshold.

When the duty cycle is lower than a predetermined threshold (such as D2), by keeping the current amplitude constant or with small change, the bias at the input of the operational amplifier has low influence to the dimming accuracy.

In one embodiment, when the duty cycle is lower than D2, if the current amplitude flowing through the power transistor is at about 100 mA, and the duty cycle of the current flowing through the LED is 50%, and accordingly the average current flowing through the LED is 50 mA; and when the duty cycle of the output current is 20%, and accordingly the average current of the LED is 20 mA. Thus, by regulating the time of the current flowing through the load, the average current flowing through the load is regulated accurately.

In one embodiment, in one conduction cycle of the power transistor, the current amplitude is controlled to decrease firstly at a former period and then increase at a later period. For example, in one cycle period of the input voltage, the conduction duration time is Ton, during the current amplitude regulating mode, the current amplitude during the former half period Ton/2 decreases and during the later half period Ton/2 increases, with reference to FIG. 6.

In one embodiment, the duty cycle of the PWM dimming signal is higher than a predetermined threshold m, the conduction duration of the power transistor is Ton; and in the former half period of Ton, the control circuit controls the current flowing through the power transistor Q increase to a maximum current Imax and then decrease; and in the later half period of Ton, the control circuit controls the current increase until reach the maximum current Imax at the end of the later half period.

Figure 5:
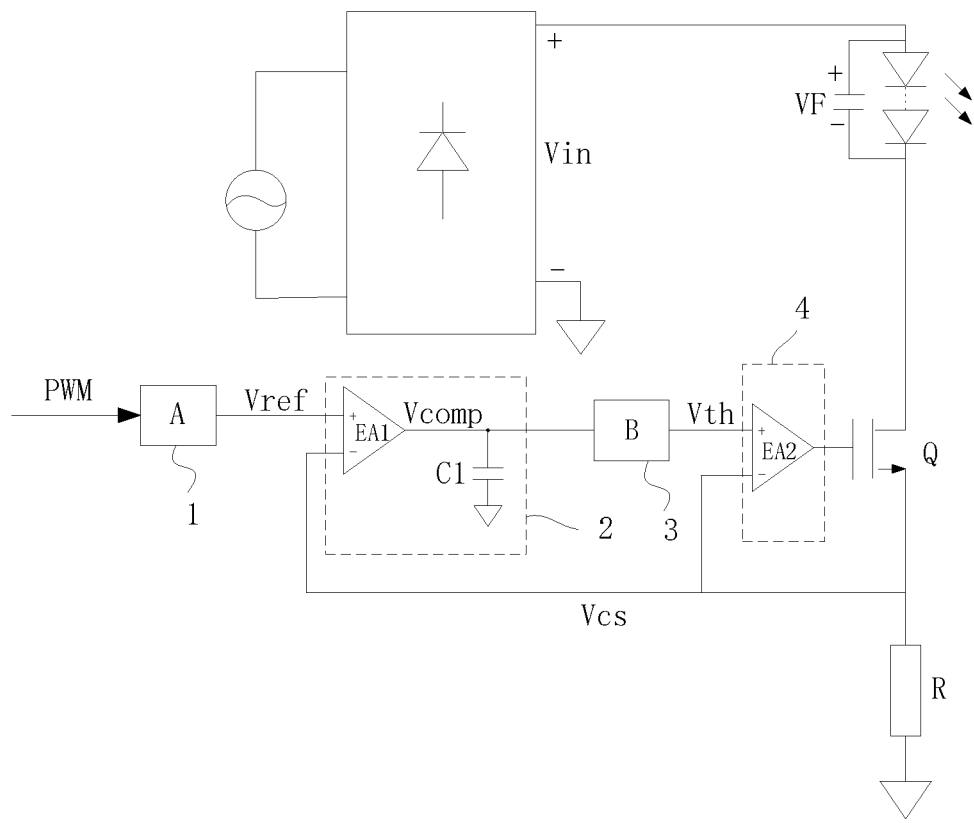
FIG. 5 illustrates a circuit diagram of a LED driving system according to an embodiment of the present application.

FIG. 5 illustrates a circuit diagram of a LED driving system according to an embodiment of the present application. The LED driving system comprise a power transistor Q, a control circuit for controlling the power transistor Q and a LED load. The power transistor Q is coupled in series with the LED load, where the anode of the LED is coupled to the input power terminal to receive the input voltage Vin, the cathode of the LED is coupled to one terminal of the power transistor Q, and another terminal of the power transistor Q is coupled to the reference ground. In another embodiment, the power transistor Q is coupled to the input power terminal and the LED load is coupled to the reference ground. In other words, a first terminal of the serially coupled power transistor and LED load as a whole is coupled to the input power terminal to receive the input voltage Vin, and the second terminal of the serially coupled power transistor and LED load is coupled to the reference ground. By regulating the conduction state of the power transistor Q, the power transistor Q provides driving current for the LED load. In one embodiment, if the duty cycle of the PWM dimming signal is higher than a threshold m1, and at the time duration when the input voltage Vin is higher than the driving voltage VF (or called the forward voltage) of the load, the power transistor Q is controlled at conduction state (ON state) for all the time; and if the duty cycle of the PWM dimming signal is lower than a threshold m2, and at the time duration when the input voltage Vin is higher than the driving voltage VF, the power transistor Q is controlled at conduction state at only part of the time, that is the power transistor Q is in conduction state for some time and is in non-conduction state (OFF state) for the other time, wherein m2 is lower than or equal with m1.

In one embodiment, the power transistor Q comprises a Field Effect Transistor (FET), such as a Metal-Oxide-Semiconductor Field Effect Transistor (MOSFET) or a Junction Field Effect Transistor (JFET).

In one embodiment, as shown in FIG. 5, the load comprises an array of LEDs and a capacitor coupled in parallel with the LEDs. Of course, the load is not limited to the embodiment as shown in FIG. 5 and can be in other configuration or in other type.

Figure 10:
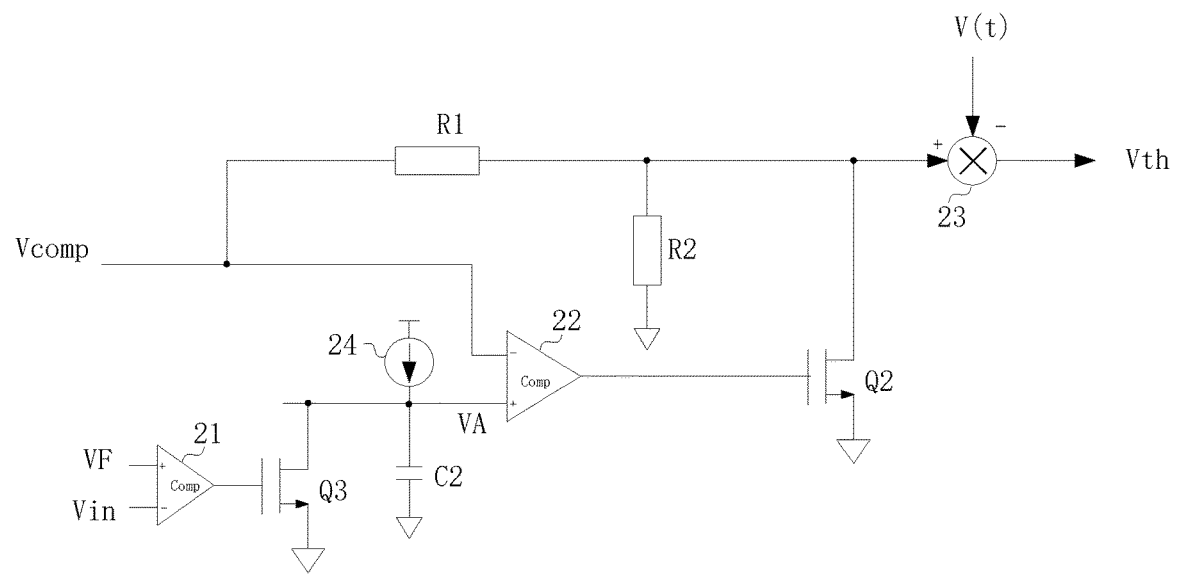
FIG. 10 illustrates a circuit diagram of a second reference signal generating circuit according to an embodiment of the present application.

In one embodiment, the control circuit comprises a reference signal generator (including circuits 1, 2 and 3) and a current regulation circuit 4. The reference signal generator has an input and an output, wherein the input of the reference signal generator receives a PWM dimming signal, and the output of the reference signal generator provides a current reference signal Vth. When the representative value of the dimming signal PWM is lower than a threshold, the reference signal generator sets the current reference signal Vth at zero for some time to turn OFF the power transistor Q. When the representative value of the dimming signal PWM decreases, the time duration of the zero voltage of current reference signal Vth increases. In one embodiment, referring to the second reference signal generator as illustrated in FIG. 10, the reference signal generator comprises a comparing circuit 22 and a switch Q2 having a control end coupled to the output of the comparing circuit 22, wherein one end of the switch Q2 is coupled to the reference ground and the other end of the switch Q2 is coupled to the output of the reference signal generator. When the representative value of the dimming signal is lower than the predetermined threshold, signal Comp would be lower than signal VA in part of the time during when the input voltage Vin is higher than the driving voltage VF, and the comparing circuit 22 is turned on to set the current reference signal Vth to Zero voltage. The current regulation circuit 4 has a first input, a second input and an output, wherein the first input of the current regulation circuit 4 is coupled to the output of the reference signal generator to receive the current reference signal Vth, the second input of the current regulation circuit 4 is coupled to a current sampling resistor R configured to receive a current sampling signal representing the current flowing the power transistor Q, and the output of the current regulation circuit 4 is coupled to a control end of the power transistor Q.

In the shown embodiment in FIG. 5, the control circuit comprises a first reference signal generating circuit 1, an average current compensating circuit 2, a second reference signal generating circuit 3 and a current regulation circuit 4.

The first reference signal generating circuit 1 having an input configured to receive a PWM signal and an output providing a first reference signal Vref, wherein the first reference signal Vref is generated based on the PWM signal. The output of the first reference signal generating circuit 1 is coupled to an input of the average current compensating circuit 2.

The average current compensating circuit 2 has a first input, a second input and an output, wherein the first input of the average current compensating circuit 2 is coupled to the output of the first reference signal generating circuit 1, the second input of the average current compensating circuit 2 is coupled to a current sampling resistor R to obtain a current sampling signal, and the output of the average current compensating circuit 2 provides a compensating signal Vcomp. In one embodiment, the average current compensating circuit 2 obtains the compensating signal Vcomp by amplifying and compensating the difference between the first reference signal Vref and the current sampling signal.

The second reference signal generating circuit 3 has an input and an output, wherein the input of the second reference signal generating circuit 3 is coupled to the output of the average current compensating circuit 2, and the output of the second reference signal generating circuit 3 provides a second reference signal Vth, also called the current reference signal.

The current regulation circuit 4 has a first input, a second input and an output, where the first input of the current regulation circuit 4 is coupled to the output of the second reference signal generating circuit 3 to receive the second reference signal, the second input of the current regulation circuit 4 receives the current sampling signal, and the output of the current regulation circuit 4 is coupled to the control end of the power transistor Q. The current regulation circuit 4 amplifies the differential signal between the sampling signal and the second reference signal Vth, and the output of the current regulation circuit 4 provides a control signal to control the power transistor Q.

In one embodiment, the average current compensating circuit 2 comprises a first error amplifying circuit EA1, and the current regulation circuit 4 comprises a second error amplifying circuit EA2. In one embodiment, the average current compensating circuit 2 may further comprises a capacitor C1 coupled between the reference ground and the output of the first error amplifying circuit EA1. The average current compensating circuit 2 may have other topologies as known to persons skilled in the art.

Figure 6:
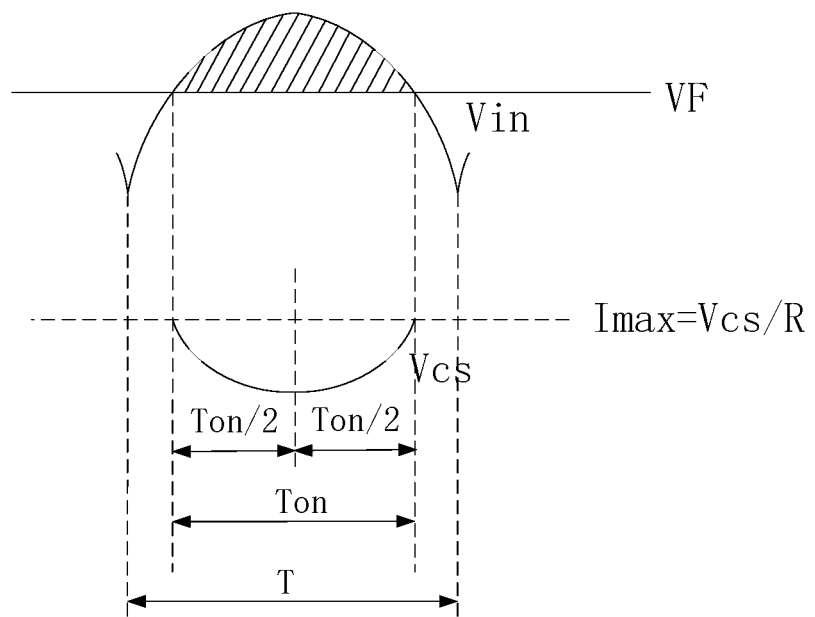
FIG. 6 illustrates a waveform diagram showing the current flowing through the power transistor according to an embodiment of the present application.

FIG. 6 illustrates a waveform diagram of signal Vcs showing the current flowing through the power transistor according to an embodiment of the present application. In this embodiment, the duty cycle of the PWM dimming signal is higher than a predetermined threshold m, and the conduction time in one cycle period T of the input voltage Vin is illustrated as Ton which corresponds to the time when the input voltage Vin is higher than the load driving voltage VF. The current flowing through power transistor Q is illustrated as the current sampling signal Vcs. In one embodiment, in the former half period of Ton, the control circuit controls the current flowing through power transistor Q decreases from a maximum value Imax; and in the later half period of Ton, the control circuit controls the current flowing through power transistor Q increases to a maximum value Imax. In another embodiment, the maximum value in the former half period may be different from the maximum value in the later half period. The maximum value Imax is controlled by compensating signal Vcomp. When the duty cycle of the PWM dimming signal decreases, the first reference signal Vref decreases, and the maximum value Imax controlled by the compensating signal Vcomp also decreases. When the first reference signal Vref increases, the maximum current value Imax increases accordingly.

In one embodiment, the current regulation circuit 4 controls the amplitude and time of the current flowing through the power transistor Q. In one embodiment, when the duty cycle of the PWM dimming signal is lower than the predetermined value m, and when the input voltage Vin is higher than the driving voltage VF, the current regulation circuit 4 controls the average current in one cycle period T of Vin (half of the mains power cycle) by controlling the time of current flowing through the power transistor Q, and the time decreases when the duty cycle of the PWM dimming signal decreases. And when the duty cycle of the PWM dimming signal is higher than the predetermined value m, and when the input voltage Vin is higher than the driving voltage VF, the current regulation circuit 4 controls the average current in one cycle period T of Vin (half of the mains power cycle) by controlling the amplitude of the current flowing through the power transistor Q, and the current amplitude increases when the duty cycle of the PWM dimming signal increases.

Accordingly, the current flowing through the power transistor Q has two status:

In the first status, the duty cycle of the PWM dimming signal is lower than a predetermined value m, referring to region 0-D2 in FIG. 4. During the time when Vin>VF, the power transistor Q is partly turned on, and the average current flowing through the power transistor Q is relatively low compared with that in region D2-D1, and the time of current flowing through the power transistor Q decreases when the duty cycle of the PWM dimming signal decreases.

In the second status, the duty cycle of the PWM dimming signal is higher than a predetermined value m, referring to region D1-D2 of FIG. 4. During the time when Vin>VF, the power transistor Q is in ON state all the time, and the average current flowing through the power transistor Q increases when the duty cycle of the PWM dimming signal increases by controlling the amplitude of the current reference signal Vth. In one embodiment, in the second status, the duty cycle of the PWM dimming signal can be as high as 100%.

In one embodiment, the current reference signal Vth in one cycle period of Vin has a saddle shape which has a higher value at the side region than the value at the middle region. In one embodiment, the current flowing through the power transistor Q decreases from a maximum current Imax in the former half period Ton/2 and increases to a maximum current Imax in the later half period Ton/2 in one period Ton when the input voltage Vin is higher than the driving voltage VF of the load. Because the power consumption of the power transistor Q is (Vin-VF)*Io, where Io is the current flowing through the power transistor, by controlling the current waveform in a shape as illustrated in FIG. 6, the power consumption of the power transistor Q is low.

In one embodiment, in order to satisfy $$\int_0^T i_0(t)dt = \frac{V_{ref}}{R}$$

according to the control circuit as illustrated in FIG. 5, the maximum current Imax is controlled by the compensating signal Vcomp. When the duty cycle of the PWM dimming signal decreases, the first reference signal Vref decreases, and the maximum current Imax controlled by compensating signal Vcomp decreases accordingly, and vice versa. In this solution, the average current flowing through power transistor Q is constant. In other embodiments, the compensating signal Vcomp can be generated based on other signals, such as the current flowing through the LED load.

Figure 7A:
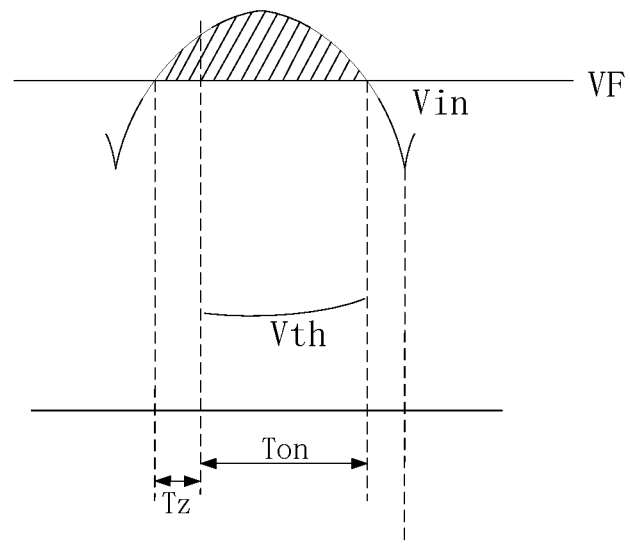
FIG. 7A illustrates a waveform diagram of a current reference signal when the power transistor Q works in the first status according to an embodiment of the present application.

FIG. 7A illustrates a waveform diagram of a current reference signal when the power transistor Q works in the first status according to an embodiment of the present application. During the time period when Vin>VF (the shadow zone), the power transistor Q remains in OFF state at first for time Tz, and at the end of Tz, the power transistor Q is turned ON and current flows until when Vin is lower than VF to have an ON time period Ton in one cycle period of Vin.

Figure 7B:
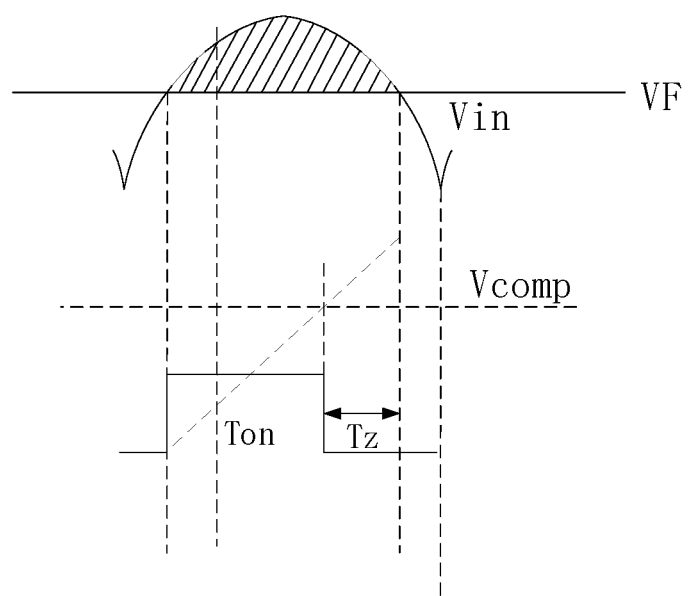
FIG. 7B illustrates a waveform diagram of a current reference signal when the power transistor Q works in the first status according to another embodiment of the present application.

FIG. 7B illustrates a waveform diagram of a current reference signal when the power transistor Q works in the first status according to another embodiment of the present application. During the time period when Vin>VF (the shadow zone), the power transistor Q is turned ON at first lasting for time Ton, and at the end of Ton, the power transistor Q is turned OFF until the next cycle.

Figure 8:
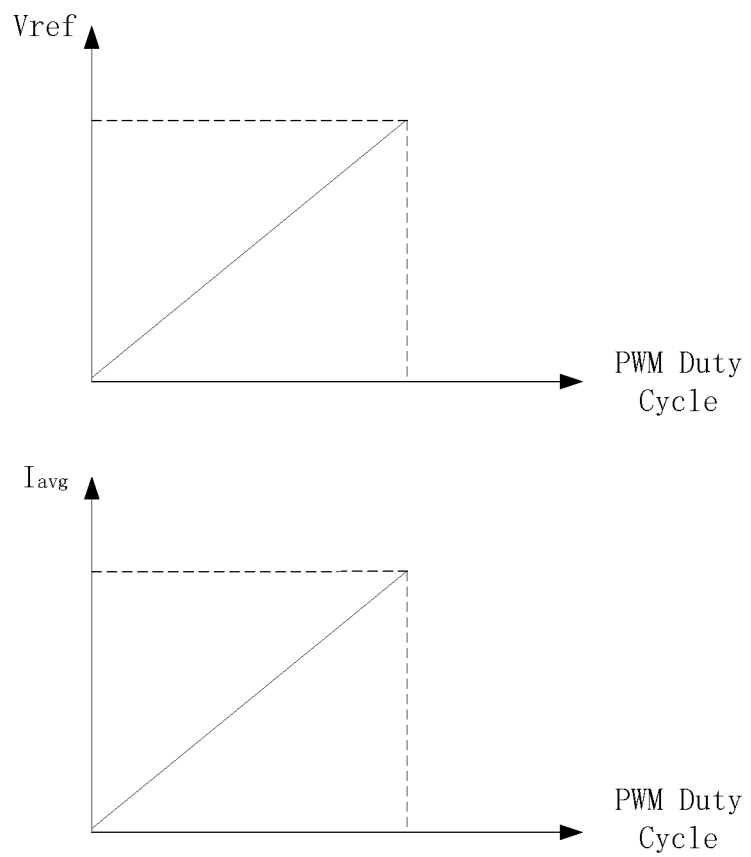
FIG. 8 illustrates two waveform diagrams showing the relationship between the duty cycle of the PWM dimming signal and the current reference signal, and the relationship between the duty cycle and the average output current respectively, according to an embodiment of the present application.

With the above two embodiments, in the first status, the average current flowing through power transistor Q can be controlled at Vref/R even though the amplitude of the current reference signal Vth is limited, which conforms to the waveform Iavg as illustrated in FIG. 8, where the average current Iavg is proportional to the duty cycle of the PWM dimming signal even when the duty cycle is at very low value. And the current control accuracy can still be high when the representative value of the dimming signal is at low value.

In one embodiment, the control circuit comprises a reference signal generator and a current regulation circuit 4, wherein the reference signal generator comprises a first reference signal generating circuit 1, an average current compensating circuit 2 and a second reference signal generating circuit 3 as illustrated in FIG. 5. In one embodiment, first reference signal generating circuit having an input configured to receive a PWM dimming signal and an output providing a current reference signal Vth, wherein the first reference signal is generated based on the PWM signal. And when the representative value of the dimming signal is lower than a threshold, the reference signal generator configured to periodically set the current reference signal Vth at zero to turn OFF the power transistor. In one embodiment, when the representative value of the dimming signal, such as the duty cycle of the dimming signal, is lower than the threshold and when the representative value of the dimming signal decreases, the time duration of the current reference signal at zero increases. The current regulation circuit 4 has a first input, a second input and an output, wherein the first input of the current regulation circuit 4 is coupled to the output of the reference signal generator configured to receive the current reference signal Vth, the second input of the current regulation circuit 4 is configured to receive a current sampling signal Vcs representing the current flowing through the power transistor Q, and the output of the current regulation circuit 4 is coupled to a control end of the power transistor Q.

Figure 9:
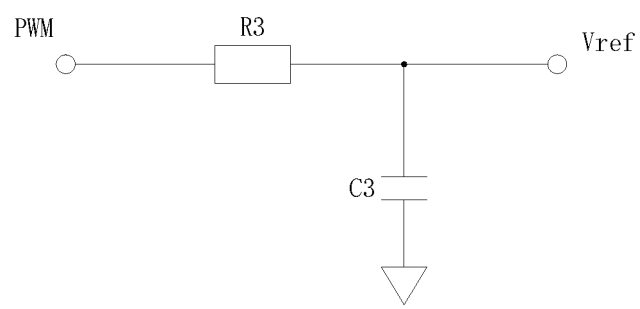
FIG. 9 illustrates a circuit diagram of a first reference signal generating circuit according to an embodiment of the present application.

FIG. 9 illustrates a circuit diagram of a first reference signal generating circuit according to an embodiment of the present application. The first reference signal generating circuit 1 (referring to FIG. 5) comprises a resistor R3 and a capacitor C3, wherein a first end of resistor R3 is coupled to the PWM dimming signal and the other end of R3 is coupled to one end of capacitor C3 to provide the first reference signal Vref, and the other end of capacitor C3 is coupled to a reference ground of the control circuit.

FIG. 10 illustrates a circuit diagram of a second reference signal generating circuit according to an embodiment of the present application. The second reference signal generating circuit 3 (referring to FIG. 5) comprises a first comparing circuit 21, a second comparing circuit 22, a multiplexer 23, two switches Q2 and Q3, a current source 24 and a capacitor C2. A non-inverting input of the first comparing circuit 21 is coupled to the input voltage terminal Vin, the inverting input of the first comparing circuit 21 receives the forward voltage VF, and an output of the first comparing circuit 21 is coupled to a gate of transistor Q3. The source of transistor Q3 is coupled to the reference ground. The current source 24 is coupled to the drain of the transistor Q3, a first end of the capacitor C2 and a non-inverting input of the second comparing circuit 22. The compensating signal Vcomp is transmitted to the inverting input of the second comparing circuit, the drain of the transistor Q2 and a first input of the multiplexer 23. The output of the second comparing circuit 22 is coupled to the gate of transistor Q2. The source of the transistor Q2 is coupled to the reference ground. A second input of the multiplexer 23 receives a reference voltage V(t), and the output of the multiplexer 23 provides the current reference signal Vth. In one embodiment, the second reference signal generating circuit further comprises two resistors R1 and R2 to get a voltage proportional to the compensating signal Vcomp and has a lower value. Wherein one end of the resistor R1 receives the compensating signal Vcomp, the other end of the resistor R1 is coupled to the first input of the multiplexer 23 and one end of the resistor R2, and the other end of resistor R2 is coupled to the reference ground.

In one embodiment, the voltage signal V(t) is $k2*\sin(\omega t)$, where the frequency of $\omega$ or V(t) equals and is in phase with the input voltage Vin. And the second reference signal $Vth = k1*Vcomp - K2*\sin(\omega t)$ and would be at zero voltage when $K1*Vcomp$ is lower than the reference signal V(t). Where k1 and k2 are positive constants. Accordingly, the current reference signal Vth has a saddle shape.

When the duty cycle of the PWM dimming signal is small, such as lower than the threshold m, and when Vin>VF, transistor Q3 is in OFF state, the current source 24 charges capacitor C2, and voltage VA increases. When VA>Vcomp, the second transistor Q2 is turned ON to set the second reference signal at Zero voltage, and accordingly, the power transistor Q is turned off. And when the duty cycle of the PWM dimming signal is higher than the threshold, the compensating signal Vcomp would be high enough and VA would not increase to reach Vcomp, and switch Q2 would not be turned ON. The comparing circuit 21, switch Q3, current source 24, capacitor C2 and comparing circuit 22 may together be called a time control circuit, configured to compare the compensating signal Vcomp with a signal VA proportional to the time, for example, to the time elapsed from the time when the input voltage Vin is higher than the driving voltage VF.

In one embodiment, the control circuit is manufactured in a semiconductor substrate to form a chip. And in one embodiment, the control circuit comprises a linear type control chip with light dimming. With the embodiments described above, it is aimed to achieve a linear type light dimming control chip with high power efficiency and high dimming accuracy.

In one embodiment, a driving circuit comprises the control circuit and the power transistor as described with reference to FIG. 5 and FIG. 10.

In one embodiment, an LED driving system comprises the control circuit, the power transistor and the LED load as described with reference to FIG. 5 and FIG. 10.

Figure 11:
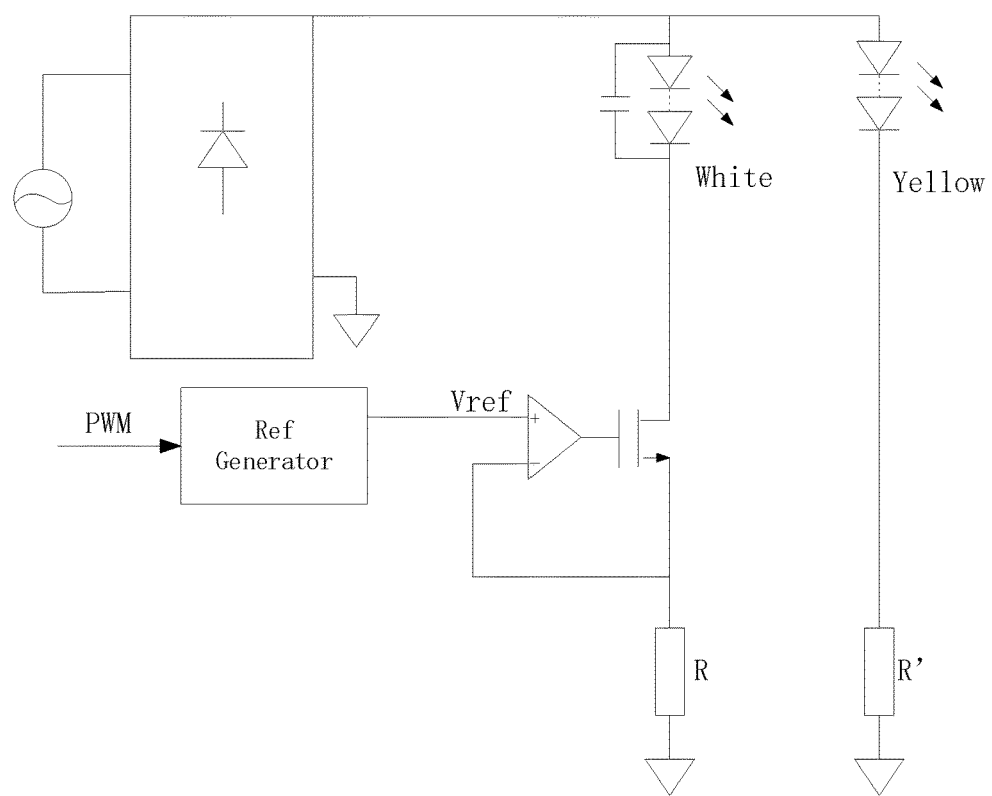
FIG. 11 illustrates a circuit diagram of an LED driving system according to an embodiment of the present application.

FIG. 11 illustrates a circuit diagram of an LED system according to an embodiment of the present application. The LED system comprises at least two arrays of LED strings. Each LED string provides a specific color and the LED strings have different colors. And at least one array of LED string is coupled in series with a power transistor which is controlled by a control circuit as described in the above embodiments. Accordingly, by controlling the average current flowing through particular LED string/strings, the color presented by the LED strings are modulated.

In one embodiment, a load is coupled in series with a power transistor, wherein the serially coupled load and transistor is supplied by an input voltage, and a control method for controlling the current flowing a load comprises: receiving a dimming signal; regulating the amplitude of the current flowing through the power transistor when the representative value of the dimming signal is higher than a first threshold; and regulating the time duration of the current flowing through the power transistor when the representative value of the dimming signal is lower than a second threshold, wherein the first threshold is equal to or higher than the second threshold.

In one embodiment, the dimming signal comprises a PWM signal and the representative value of the dimming signal is the duty cycle of the PWM signal; when the duty cycle of the PWM signal is higher than the first threshold, the amplitude of the current is regulated and the power transistor is in ON state when the input voltage is higher than the driving voltage of the load. And when the duty cycle of the PWM signal is lower than the second threshold, the power transistor is partly in ON state and partly in OFF state when the input voltage is higher than the driving voltage of the load.

In one embodiment, the method of regulating the current comprises in detail: generating a first reference signal based on a dimming signal; generating a compensating signal based on the first reference signal and a current sampling signal indicating the current flowing through the power transistor; generating a second reference signal based on the compensating signal; and controlling the power transistor based on the error amplification signal between the second reference signal and the current sampling signal.

It will be appreciated by persons skilled in the art that the present invention is not limited to what has been particularly shown and described herein above. Rather the scope of the present invention is defined by the claims and includes both combinations and sub-combinations of the various features described herein above as well as variations and modifications thereof which would occur to persons skilled in the art upon reading the foregoing description and which are not in the prior art.

I claim:

1. A control circuit for controlling a power transistor, the power transistor coupled in series with a load, wherein a first terminal of the serially coupled power transistor and load is coupled to an input power terminal having an input voltage, and a second terminal of the serially coupled power transistor and load is coupled to a reference ground, the control circuit configured to control the conduction state of the power transistor for controlling the current flowing through the power transistor, wherein the control circuit has an input configured to receive a dimming signal, and when a representative value of the dimming signal is higher than a first threshold, the control circuit regulates the amplitude of the current flowing through the power transistor, and when the representative value of the dimming signal is lower than a second threshold, the control circuit regulates the time of the current flowing through the power transistor, and wherein the second threshold is not higher than the first threshold, and wherein the load has an intrinsic forward voltage, and when a duty cycle of the PWM signal is lower than the second threshold and when the input voltage of the input power is higher than the forward voltage, the time duration of the current flowing through the power transistor decreases when the duty cycle of the PWM signal decreases; and when the duty cycle of the PWM signal is higher than the first threshold and when the input voltage is higher than the forward voltage, the power transistor conducts current all the time and the average current flowing through the power transistor increases when the duty cycle of the PWM signal increases.

2. The control circuit according to claim 1, wherein the dimming signal comprises a pulse width modulation (PWM) signal, and wherein:

when the duty cycle of the dimming signal is higher than the first threshold, the control circuit is configured to regulate the amplitude of the current flowing through the power transistor, and when the duty cycle increases, the amplitude of the current flowing through the power transistor increases; and when the duty cycle of the dimming signal is lower than the second threshold, the control circuit is configured to regulate the time duration of the current flowing through the power transistor, and when the duty cycle increases, the time duration of the current flowing through the power transistor increases.

3. The control circuit according to claim 1, wherein the dimming signal comprises a pulse width modulation (PWM) signal, and wherein:

when the duty cycle of the dimming signal is higher than the first threshold and when the input voltage is higher than the load driving voltage, the control circuit is configured to control the power transistor at ON state; and when the duty cycle of the dimming signal is lower than the second threshold and when the input voltage is higher than the load driving voltage, the control circuit is configured to control the power transistor partly in ON state and partly in OFF state.

4. The control circuit according to claim 1, when regulating the amplitude of the current flowing through the power transistor, during each conducting period of the power transistor, the control circuit is configured to control the current flowing through the power transistor decreases at a former period and increases at a later period.

5. The control circuit according to claim 1, comprising:

a reference signal generator configured to provide a current reference signal, and wherein when the duty cycle of the dimming signal is higher than the first threshold, the reference signal generator varies the amplitude of the current reference signal according to the dimming signal; and wherein when the duty cycle of the dimming signal is lower than the second threshold, the reference signal generator sets the current reference signal at zero periodically, wherein the duration of the zero state is varied according to the dimming signal; and a current regulation circuit configured to control the power transistor based on the current reference signal and a current sampling signal indicative of the current flowing through the power transistor, and to control the current flowing through the power transistor following the current reference signal.

6. The control circuit according to claim 1, comprising:

a reference signal generator having an input and an output, wherein the input of the reference signal generator receives the dimming signal, and the output of the reference signal generator provides a current reference signal, and when the representative value of the dimming signal is lower than the second threshold, the reference signal generator configured to periodically set the current reference signal at zero to turn OFF the power transistor, and wherein when the representative value of the dimming signal decreases, the time duration of the current reference signal at zero increases; and a current regulation circuit having a first input, a second input and an output, wherein the first input of the current regulation circuit is coupled to the output of the reference signal generator, the second input of the current regulation circuit is configured to receive a current sampling signal representing the current flowing the power transistor, and the output of the current regulation circuit is coupled to a control end of the power transistor.

7. The control circuit according to claim 1, comprising:

a first reference signal generating circuit having an input configured to receive a PWM signal and an output providing a first reference signal, wherein the first reference signal is generated based on the PWM signal;

an average current compensating circuit having two inputs configured to receive a current sampling signal and the first reference signal, and an output providing a compensating signal;

a second reference signal generating circuit having an input coupled to the output of the average current compensating circuit, and an output providing a second reference signal; and a current regulation circuit having two inputs and an output, the two inputs configured to receive the current sampling signal and the second reference signal, the current regulation circuit configured to amplify the differential signal between the sampling signal and the second reference signal, and the output of the current regulation circuit provides a control signal to control the power transistor.

8. The control circuit according to claim 7, wherein the second reference signal generating circuit comprises:

a first comparing circuit configured to compare the input voltage with the forward voltage, the first comparing circuit having an output;

a second comparing circuit having a first input, a second input and an output, wherein the first input of the second comparing circuit is coupled to the output of the average current compensating circuit;

a second transistor having a first end, a second end and a control end, wherein the first end is coupled to the reference ground, the second end is coupled to the output of the average current compensating circuit, and the control end is coupled to the output of the second comparing circuit;
a third transistor having a first end, a second end and a control end wherein the control end of the third transistor is coupled to the output of the first comparing circuit, the first end of the third transistor is coupled to the reference ground;
a second capacitor having a first end and a second end, wherein the first end of the second capacitor is coupled to the reference ground;
a current source having an output coupled to the second end of the third transistor, the second end of the second capacitor and the second input of the second comparing circuit; and
a multiplexer having a first input, a second input and an output, wherein the first input of the multiplexer is coupled to the second end of the second transistor, the second input of the multiplexer is coupled to a reference voltage, and the output of the multiplexer is configured to provide the second reference signal.

9. The control circuit according to claim 7, wherein when the input voltage is higher than the forward voltage, the second reference signal has a value of Vth=k1*Vcomp−k2*sin(ωt), and wherein Vcomp represents the compensating signal, sin(ωt) corresponds to the phase of the input voltage, each of k1 and k2 is a positive constant.

10. The control circuit according to claim 7, wherein the second reference signal generating circuit comprising:
a time control circuit configured to compare the compensating signal with a signal proportional to the time;
a switch controlled by the time control circuit to selectively couple the output of the second reference signal generating circuit to the reference ground; and
a multiplexer having a first input, a second input and an output, wherein the first input of the multiplexer is configured to receive the compensating signal, the second input of the multiplexer is coupled to a reference voltage corresponding to the input voltage, and the output of the multiplexer is coupled to the output of the second reference signal generating circuit.

11. The control circuit according to claim 1, wherein the power transistor comprises a MOSFET.

12. An LED driving system comprising:
an LED;
a power transistor coupled in series with the LED, wherein a first terminal of the serially coupled power transistor and LED is coupled to an input power terminal having an input voltage, and a second terminal of the serially coupled power transistor and LED is coupled to a reference ground; and
a control circuit coupled to a control end of the power transistor for regulating current flowing through the LED, wherein the control circuit has an input coupled to a dimming signal, and when a representative value of the dimming signal is higher than a first threshold, the control circuit regulates the amplitude of the current flowing through the power transistor based on the dimming signal, and when the representative value of the dimming signal is lower than a second threshold, the control circuit regulates the time of the current flowing through the power transistor based on the dimming signal, and wherein the second threshold is not higher than the first threshold, and wherein the LED has an intrinsic forward voltage, and when a duty cycle of the PWM signal is lower than the second threshold and when the input voltage of the input power is higher than the forward voltage, the time duration of the current flowing through the power transistor decreases when the duty cycle of the PWM signal decreases; and
when the duty cycle of the PWM signal is higher than the first threshold and when the input voltage is higher than the forward voltage, the power transistor conducts current all the time and the average current flowing through the power transistor increases when the duty cycle of the PWM signal increases.

13. The LED driving system according to claim 12, comprising at least two LED strings, the at least two LED strings have at least two different colors, and wherein one LED string is coupled in series with the power transistor controlled by the control circuit to regulated the color provided by the LED driving system.

14. A control method for controlling current flowing through a load, the load coupled in series with a power transistor, the method comprising:
receiving a dimming signal;
regulating the amplitude of the current flowing through the power transistor when the representative value of the dimming signal is higher than a first threshold; and
regulating the time duration of the current flowing through the power transistor when the representative value of the dimming signal is lower than a second threshold, wherein the first threshold is equal to or higher than the second threshold, and wherein the load has an intrinsic forward voltage, and
when a duty cycle of the PWM signal is lower than the second threshold and when the input voltage of the input power is higher than the forward voltage, the time duration of the current flowing through the power transistor decreases when the duty cycle of the PWM signal decreases; and
when the duty cycle of the PWM signal is higher than the first threshold and when the input voltage is higher than the forward voltage, the power transistor conducts current all the time and the average current flowing through the power transistor increases when the duty cycle of the PWM signal increases.

15. The method according to claim 14, wherein the dimming signal comprises a PWM signal and the representative value of the dimming signal is the duty cycle of the PWM signal;
when the duty cycle of the PWM signal is higher than the first threshold, the amplitude of the current is regulated and the power transistor is in ON state when the input voltage is higher than the driving voltage of the load; and
when the duty cycle of the PWM signal is lower than the second threshold, the power transistor is partly in ON state and partly in OFF state when the input voltage is higher than the driving voltage of the load.

16. The method according to claim 14, wherein regulating the current comprising:
generating a first reference signal based on a dimming signal;
generating a compensating signal based on the first reference signal and a current sampling signal indicating the current flowing through the power transistor;
generating a second reference signal based on the compensating signal; and controlling the power transistor based on the error amplification signal between the second reference signal and the current sampling signal.

\* \* \* \* \*